United States Patent [19]

August et al.

[11] Patent Number: 4,939,624

[45] Date of Patent: Jul. 3, 1990

[54] INTERCONNECTED MULTIPLE CIRCUIT MODULE

[75] Inventors: Melvin C. August; Eugene F. Neumann; Stephen A. Bowen; John T. Williams, all of Chippewa Falls, Wis.

[73] Assignee: Cray Research, Inc., Minneapolis, Minn.

[21] Appl. No.: 284,912

[22] Filed: Dec. 14, 1988

[51] Int. Cl.[5] .................... H05K 9/00

[52] U.S. Cl. .................... 361/424; 361/386; 361/389; 361/406; 361/412; 361/413; 361/426; 439/75

[58] Field of Search .................... 361/386–389, 361/393, 396, 400, 406, 408, 412, 413, 424, 426; 439/74, 75, 92–95, 485, 487, 607–608, 816, 825, 44, 45

[56] References Cited

U.S. PATENT DOCUMENTS

| | | | |
|---|---|---|---|
| 2,694,799 | 11/1954 | Del Camp . | |
| 2,969,521 | 1/1961 | Scoville . | |
| 3,022,480 | 2/1962 | Tiffany . | |
| 3,097,032 | 7/1983 | Hochheiser . | |
| 3,212,049 | 10/1985 | Mittler et al. . | |
| 3,333,225 | 7/1967 | McNutt . | |
| 3,459,998 | 8/1969 | Focarile . | |
| 3,568,001 | 3/1981 | Strauss . | |
| 3,670,409 | 11/1970 | Reimer . | |
| 3,832,603 | 8/1974 | Cray . | |
| 3,904,934 | 3/1973 | Martin . | |
| 4,295,184 | 10/1981 | Roberts . | |
| 4,352,533 | 10/1982 | Murase et al. . | |
| 4,514,784 | 4/1985 | Williams et al. | 361/386 |
| 4,700,996 | 10/1987 | August et al. . | |
| 4,720,770 | 1/1988 | Jameson | 361/424 |
| 4,734,058 | 3/1988 | Pavlacka | 439/607 |
| 4,797,113 | 1/1989 | Lambert | 439/74 |
| 4,813,128 | 3/1989 | Massopust . | |

OTHER PUBLICATIONS

Article: "Connector Interposer for Module to Board Connection", Martyak, Natoli & Ricci; *IBM Technical Disclosure Bulletin,* vol. 14, No. 8, Jan. 1972, p. 2297.

*Primary Examiner*—Gregory D. Thompson
*Attorney, Agent, or Firm*—Merchant, Gould, Smith, Edell, Welter & Schmidt

[57] ABSTRACT

An improved multiple circuit module for use in an electronic device includes a number of cold plates sandwiched between pairs of circuit boards for taking away excess heat from the circuit boards. Each plate is provided with open spaces which permit communication between the circuit boards, and with circuit boards on other cold plates. Electrical communication between the circuit boards is effected by an array of metallic pins. The pins are received in a perforate pin header which extends along the depth of the cold plate, and pins communicating with other circuit boards extend into a connector block which is placed between a pair of pin headers. Shielding is provided in both the connector blocks and pin headers to prevent electronic cross-talk between pins disposed therein. In one embodiment, a novel type of pin which reduces installation and disconnection friction is utilized.

23 Claims, 6 Drawing Sheets

FIG. 2
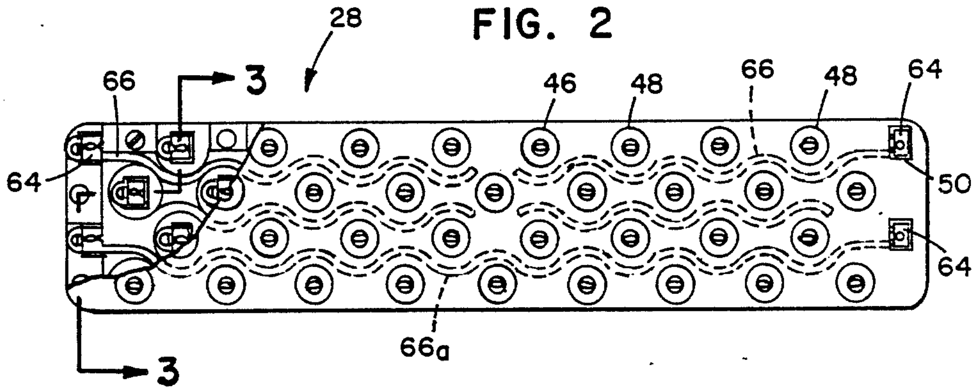
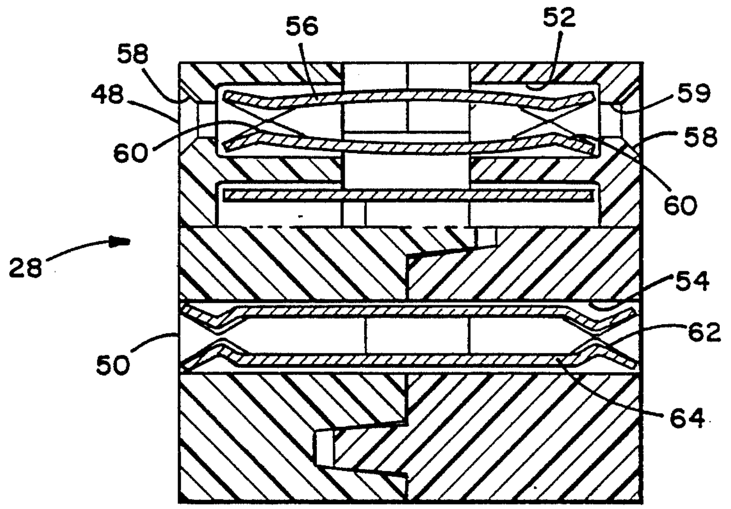
FIG. 3
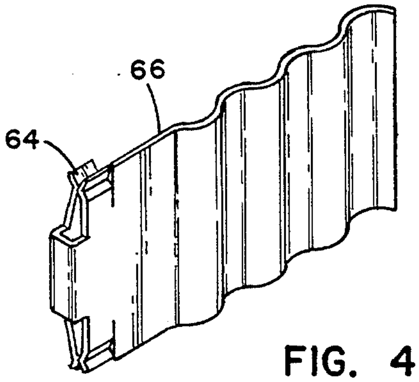
FIG. 4

FIG. 5
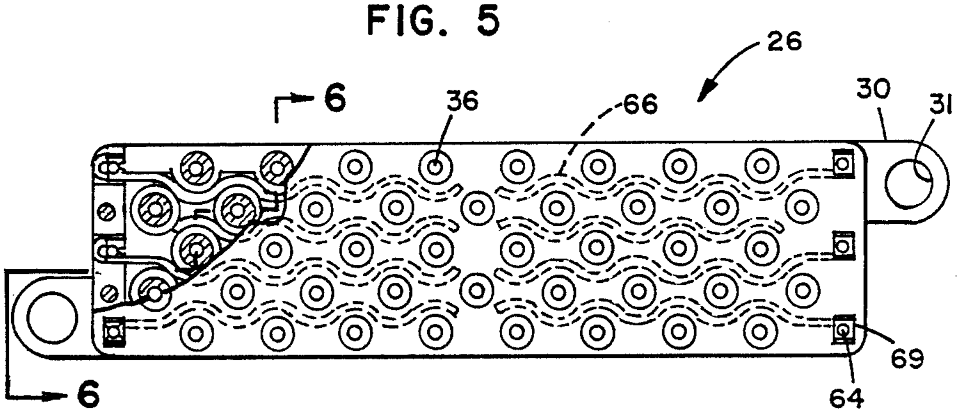
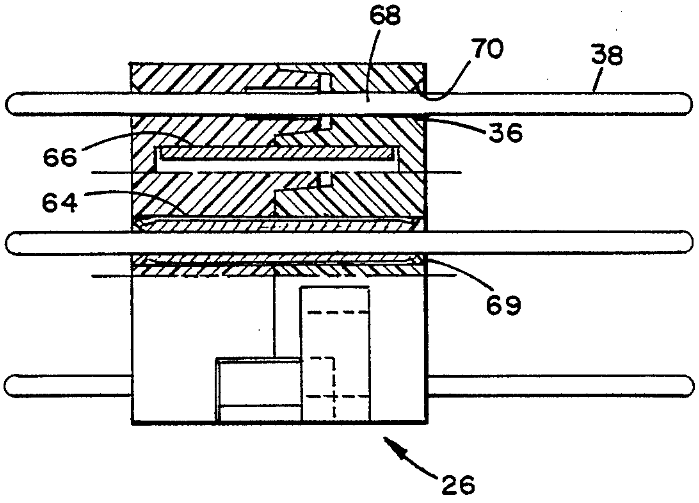
FIG. 6

INTERCONNECTED MULTIPLE CIRCUIT MODULE

BACKGROUND OF THE INVENTION

1. Field or the Invention

The present invention relates to multiple circuit modules which are used in electronic devices such as high-speed digital computers of the type produced by Cray Research, the assignee hereof. Specifically, the present invention relates to an improved multiple circuit module which requires less force to assemble and reduces cross-talk between circuit paths.

2. Description of the Prior Art

Circuit boards are utilized in many types of electronic equipment and it is often necessary, particularly in complex equipment, to interconnect the circuit boards into a module, and to interconnect modules into multiple circuit modules. For example, high-speed electronic digital computers of the type produced by Cray Research utilize circuit modules consisting of four circuit boards mounted in close proximity on opposite sides of two cooling plates. Such circuit modules are arranged in banks and it is, therefore, desirable to interconnect adjacent circuit boards within a module in a manner which permits convenient disconnection for service and reconnection after service, and which also permits reversed stacking for testing.

One previously known example of an interconnected multiple circuit module is disclosed in U.S. Pat. No. 4,514,784 to Williams et al. In this apparatus, conductive pins were used to transmit signals from one circuit module to another. Electrical connection between the pins was accomplished by connector blocks positioned between the modules having bores defined therein for receiving the pins. This type of module connection was a great improvement over previous designs because it minimized twisting and misalignment of the connector elements, while facilitating connection over the shortest circuit paths.

However, as the architecture of high-speed electronic digital computers evolves, greater switching speed and circuit density are required. As circuit density increases, a greater number of connections are necessary between modules, thereby increasing the total force needed to connect the modules. In addition, as circuit density is increased, it becomes increasingly likely that induction caused by the transmission of a signal through a first circuit path will possibly affect the operation of an adjacent path. This phenomenon is known as cross-talk, and is a major impediment to improved circuit density in high-speed digital computers.

It is clear that there has existed a long and unfilled need in the prior art for an improved interconnected multiple circuit module which reduces the aggregate force necessary for assembly and disassembly, and which reduces inductive interference between adjacent circuit paths.

SUMMARY OF THE INVENTION

Accordingly, it is an object of the present invention to provide an improved interconnected multiple circuit module which reduces the force necessary for assembly and disassembly, and which provides protection against inductive interference from adjacent signal paths. To achieve the above objects, a multiple circuit module according to the present invention includes a plurality of circuit boards arranged in facing pairs, each circuit board having a plurality of pin receiving recesses defined therein; a plurality of cold plates positioned between the circuit boards in each of the facing pairs, respectively, for conducting waste heat away from the circuit boards, each cold plate having an open space defined therein for allowing electronic communication between the circuit boards; a plurality of pin headers positioned within the open spaces, respectively, each having a plurality of through-holes defined therein; at least one connector block interposed between two of the pin headers, the connector block having a plurality of connector through-holes defined therein; a plurality of electrically conductive signal pins for conducting electrical signals from one of the circuit boards to another of the circuit boards, the signal pins being selectively insertable in the pin receiving recesses, the through-bores and the connector bores, depending on the desired path of the signals; and shielding structure for shielding a selected number of signal pins against induction from other signal pins, whereby electric cross-talk between circuits is reduced.

These and various other advantages and features of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

BRIEF DESCRIPTION OF THE DRAWINGS

FIG. 2 is a top plan view of a connector block according to the embodiment of FIG. 1 or FIG. 7, with parts broken away for clarity;

FIG. 3 is a cross-sectional view taken along lines 3—3 in FIG. 2;

FIG. 4 is an isolated view of the metallic shielding element in the embodiment of FIG. 2;

FIG. 5 is a top view of the connector block in the embodiment of FIG. 1 or FIG. 7, with parts broken away for clarity;

FIG. 6 is a cross-sectional view taken along lines 6—6 in FIG. 5;

DETAILED DESCRIPTION OF THE PREFERRED EMBODIMENT(S)

Figure 1:
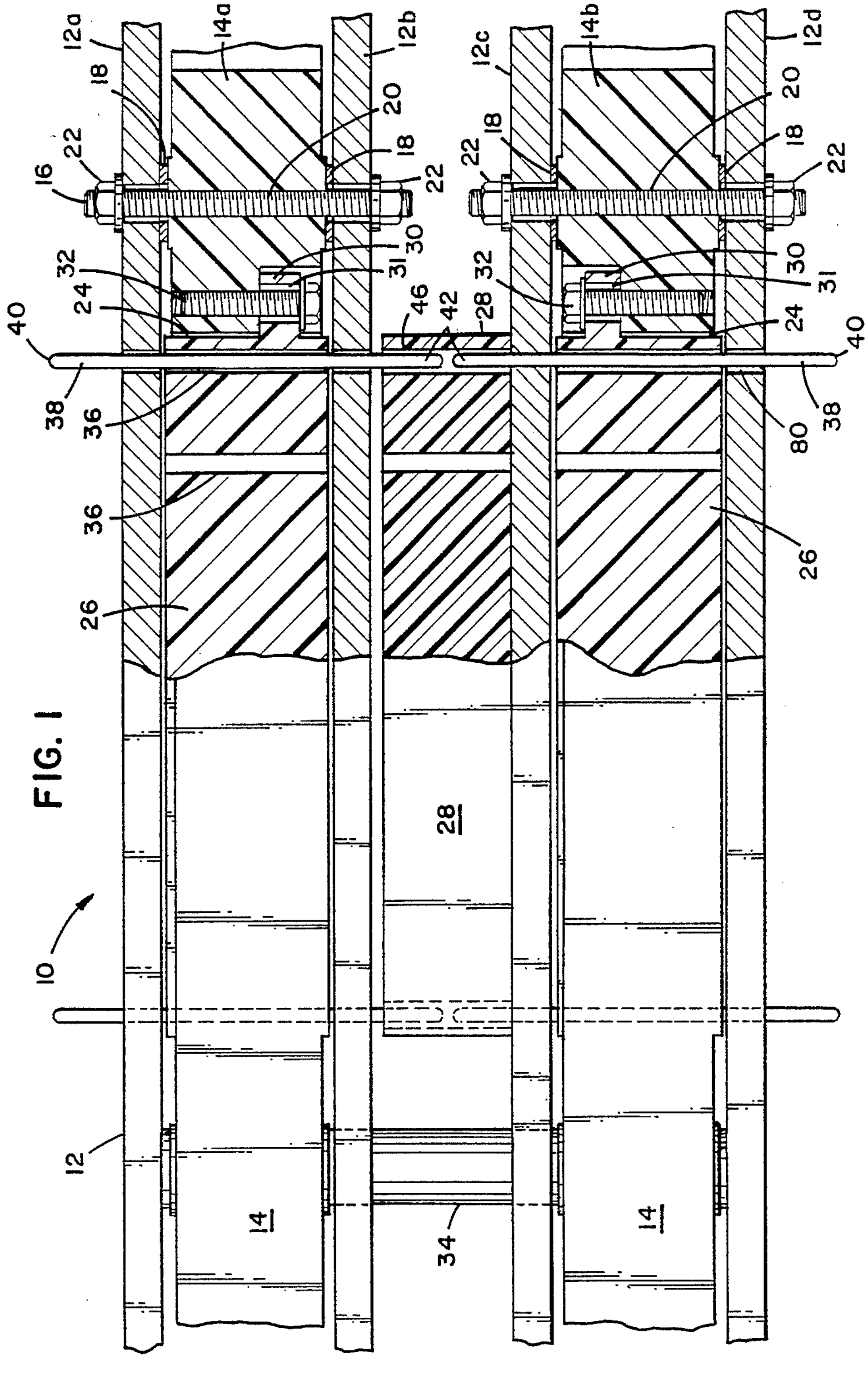
FIG. 1 is a side cutaway view, taken partially in cross-section, of a circuit module constructed according to a first embodiment of the present invention.

Referring now to the drawings, wherein like reference numerals designate corresponding elements throughout the views, and particularly referring to FIGS. 1–6, there is shown an improved interconnected multiple circuit module 10 according to a first preferred embodiment of the invention. As is best illustrated in FIG. 1, circuit module 10 includes a plurality of planar circuit boards 12*a* through 12*d*, generally referred to as 12, which are arranged to extend in a parallel, spaced relationship. In order to maintain the circuit boards 12 at a proper operating temperature, pairs of circuit boards 12*a*, 12*b* and 12*c*, 12*d* are disposed about cold plates 14*a* and 14*b* respectively, generally referred to as 14. Cold plates 14 conduct excess heat energy away from the circuit boards as described in U.S. Pat. No. 4,628,407 and is described in co-pending patent application Ser. No. 07/284,992, entitled "Cold Plate With Interboard Connector Apertures for Circuit Board Assemblies", filed on the same date as the present patent application and assigned to the assignee of the present patent application. The two pairs of circuit boards 12 disposed about two cooling plates 14 form a single module. Each pair of circuit boards 12 is secured to cold plate 14 by a spacer/connector assembly 16 which includes a pair of spacers 18 disposed between the circuit boards 12 and cold plate 14, a threaded stud 20 and a pair of fastening nuts 22, as is shown in FIG. 1.

In order to permit communication between circuitry on the various circuit boards 12, a number of open spaces are defined by surfaces 24 on each of the cold plates 14, as is shown in FIG. 1. Each of the spaces defined by surfaces 24 extend through the entire width of the corresponding cold plate 14 and has a pin header block 26 secured by means of a bolt 32 which extends through a mounting hole 31 in a tab portion of the pin header block 26, and into cold plate 14 so that tab 30 is pulled tightly against cold plate 14. Each of the pin header blocks 26 is provided with an array of through-bores or holes 36 defined therein which may be coincident with pin receiving recesses or bores defined in the attached circuit boards 12. The pin header blocks 26 may be manufactured with a pre-defined array of holes such that all the holes may not be used in a particular application. The pin header blocks 26 may also contain various types of shielding (as described in more detail below) to minimize cross-talk between adjacent pins.

In order to provide electronic signal, voltage and ground communication between the various circuit boards 12, a plurality of conductive pin members 38 extend through the recesses provided in circuit boards 12 and through the bores 36 and pin headers 26. Pins 38 may be electrically connected to circuitry on each of the various circuit boards 12 by soldering, or such connection may be effected by plating the surfaces defining the pin receiving recesses or holes on circuit boards 12. In the preferred embodiment, pins 38 are soldered to one of the circuit boards 12 of the half module to hold them in place during assembly and disassembly.

A complete circuit module is formed from four circuit boards and two cold plates, two circuit boards sandwiching each cold plate. A half circuit module is formed of a single pair of circuit boards 12, a single cold plate 14 and a pin header block 26. In order to interconnect two half modules, pins 38 may be provided with first and second end portions 40, 42, respectively, the second end 42 of which extend outwardly beyond the surfaces of circuit boards 12*b* and 12*c*. As shown in FIG. 1, a connector block 28 is freely disposed between a pair of such half modules and has an array of connector through-holes 46 defined therein for receiving end portions 42 of the connector pins 38. For example, as is shown in FIG. 1, connector hole 46 receives the second end portion 42 of pin 38 from the upper half module and a corresponding pin end portion from the lower half module so as to electrically connect the two pins 38 by means of a dual entry contact or other suitable means (not shown in FIG. 1, but described in more detail below in conjunction with FIG. 3). The two half modules are secured together by suitable means and spaced apart by means of spacer 34 controlling the amount of space and gaps between the upper and lower half modules.

The connector blocks 28 may be manufactured with a pre-defined array of holes such that all the holes may not be used in a particular placement on the circuit module. The connector blocks 28 may also contain various types of shielding (as described in more detail below) to minimize cross-talk between adjacent pins.

Referring to FIGS. 2–4, a preferred construction of connector block 28 will now be described. As shown in FIGS. 2 and 3, connector holes 46 may be either of a signal pin opening type 48 or a constant potential opening type 50, which is used to supply a ground or DC voltage connection between the various circuit boards. As best shown in FIG. 3, each of the signal pin openings 48 are formed by a pair of conical recesses 58 connected to cylindrical bores 59 which, in turn, open out into a cavity defined in the connector block 28 by a surface 52. A contact element 56 is disposed within the cavity defined by surface 52, and is formed of a resilient, electrically conductive material. Contact element 56 includes an inner surface having contact points 60 which are adapted to contact the outer surfaces of pins 38 when the pins are inserted into signal pin opening 48. Thus, electric signals may be transmitted from one pin 38 to another pin 38 when each pin is inserted into one end of the same signal pin opening 48.

Constant potential pin openings 50 are preferably defined as a cylindrical bore in connector block 28 by a surface 54. A constant potential contact element 64 which is preferably made of an electrically conductive resilient material is disposed within the board defined by surface 54 and includes a pair of inner contact points 62 which are adapted to contact outer surfaces of any ground or voltage connection pins 38 inserted therein. Thus, ground and voltage connection may be achieved between the various circuit boards 12.

The ground and voltage connections between circuit boards in a module are typically made between edge connectors and backplanes to supply voltages and ground current return paths for the operating logical circuits located on circuit boards 12. Electrical signals propagating between circuit boards 12*a*–12*d* require that a signal path be established from one board to another and a voltage or ground current return path also exists for the requisite current to flow. Traditionally, the current return paths between circuit boards in a module are supplied through the backplane connections. If, however, the current return paths are electrically stressed in that they are supplying current to a large number of switching circuits simultaneously, the voltage and ground current return paths between remote signal source and signal destination points may experience a shift in overall potential, causing slow gate switching, changing voltage switch thresholds, and lowering of noise margins. To avoid these problems, constant potential pin contact elements 64 provide additional voltage and ground current return paths between circuit boards 12 to further lower the inductance between the voltage and ground return paths between the circuit boards. Thus, in addition to providing shielding between the signal pins (as more fully discussed below), the contact elements 64 further serve to maintain all the voltage and ground plains on circuit boards 12 at the same relative potential in module 10.

In order to shield the selected signal pins against inductive disturbances from adjacent pins, a metallic shielding element 66 is interposed between selective signal pin openings 48 and is electrically connected to one of the constant potential resilient contacts 64, as is shown in FIG. 2. In the embodiment of FIGS. 2–4, signal pin openings 48 are arranged in rows which are offset with respect to adjacent rows and substantially aligned with next to adjacent rows. Shielding element 66 extends substantially through the entire thickness of connector block 28 in the axial direction of signal pin openings 48, and is preferably given a wave-like shape, as may be seen in the isolated view of shielding element 66 which is provided in FIG. 4. As shown in FIG. 2, wave-type shielding element 66 is interposed between adjacent rows of the signal pin openings 48 so as to reduce inductive interference or cross-talk between the rows. Shielding elements 66 function effectively to reduce interference whether they are connected to ground or to a constant DC voltage source.

As shown in FIG. 2, some wave-type shielding elements 66 are constructed and place so that only one-half the distance between ends are covered by a single shielding element 66. An alternate embodiment shows some wave-type shielding elements **66*a*** extending the entire distance between ends of the connector block. This reduces the number of separate constant potential paths between circuit boards but improves the shielding.

Referring to FIGS. 5 and 6, pin header blocks 26 are also preferably provided with metallic shielding elements 66 of the same or similar type to those used for shielding in the connector blocks 28. Within the pin header 26, shielding elements 66 separate adjacent rows of signal pin openings 36 and are electrically connected to ground or DC voltage pins through constant potential pin contacts 64 disposed within openings 69. As shown in FIG. 6, signal pin opening 36 includes a conical recess 70 leading to a cylindrical bore 68 which extends through the pin header block 26. A resilient contact member 64 is disposed within the constant potential signal pin opening 69 and is electrically connected to the metallic shielding 66, as is above described.

Figure 7:
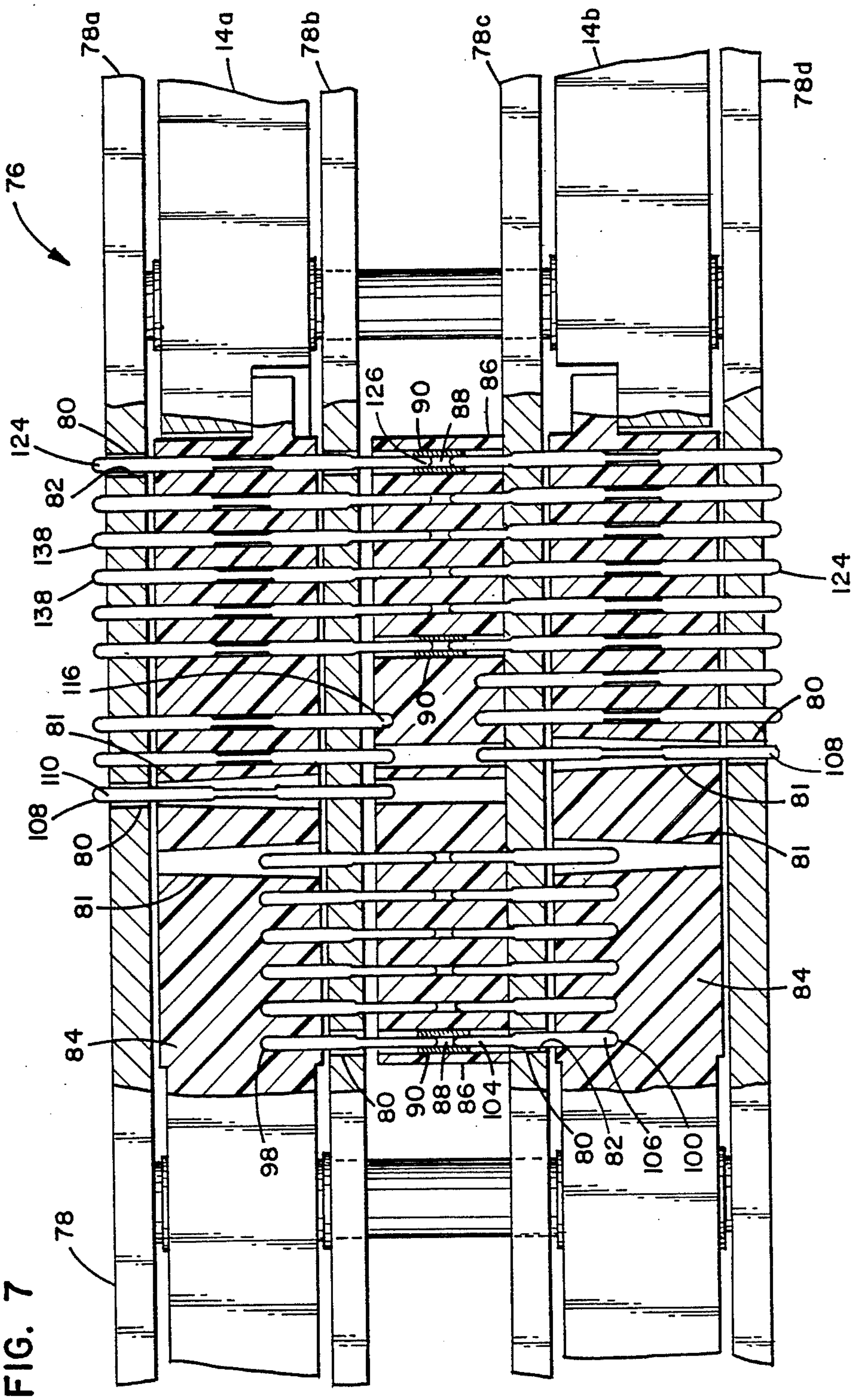
FIG. 7 is a side cutaway view of a circuit module constructed according to a second embodiment of the instant invention, taken partially in cross-section.

A second preferred embodiment 76 of a circuit module interconnection assembly is generally indicated at FIGS. 7 and 9–11. In this embodiment, circuit boards **78*a*, 78*b*, 78*c* and 78*d* (generally referred to as 78) are disposed in pairs about cold plates 14*a* and 14*b* (generally referred to as 14) in the same manner as in the above-described embodiment. This sandwich configuration comprises an upper half module and a lower half module electrically connected together, each half module comprising two circuit boards attached to opposite sides of a cooling plate. In this embodiment, each of the circuit boards 78 are provided with a plurality of signal pin receiving holes or recesses 80 having metallized surfaces 82 which are electrically connected to the circuitry on circuit board 78 as may be required. A free pin header block 84 having a plurality of tapered pin alignment holes 81 as shown in FIG. 7 (only a few shown for clarity) is disposed within an opening defined in cold plate 14, in a similar manner as in the above-described embodiment. Resilient pins 108 and 124 are inserted through recesses 80 from, for example, circuit board 78*b* through tapered holes 81 of pin header block 84 which self-aligns pins 108 and/or 124 into recesses 80 of circuit board 78*a*. Likewise, pins 108 and 124 are also inserted through recesses 80 from circuit board 78*c* through tapered holes of pin header block 84 which self-aligns pins 108 and/or 124 into recesses 80 of circuit board 78*d***.

A dual entry connector block 86 is provided between the half modules for electrical communication therebetween, and has an array of connector through-holes 88 defined therein, each having a means of conducting current between the pins of the upper and lower half modules. This means may take the form of dual-entry contacts 90 such as the type described above in conjunction with connector block 28 of FIG. 3. In the alternative, when the pins are used to conduct current between the modules the pins may be contacted with through-plated holes in connector block 86.

Figure 9:
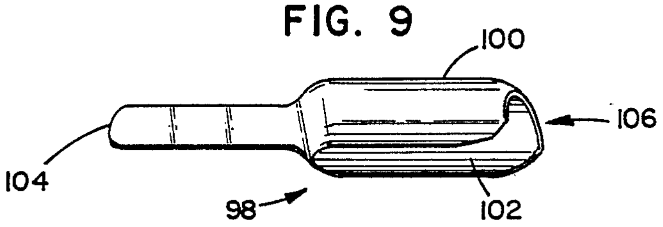
FIG. 9 is an isolated perspective view of a first species of connector pin according to the embodiment of FIG. 7.

In order to provide electrical connection between the various circuit boards in the interconnected module assembly, three optional lengths and types of connector pins are provided. In order to provide a connection between a through-plated hole 80 on circuit board **78*a* and the dual-entry contact 90 of connector block 86, a board to connector-type pin 98 is used, as is illustrated in FIGS. 7 and 9. Board to connector-type pin 98 has a first end portion 104 with a first compliant section and a second end portion 106 having a second compliant section which, in the preferred embodiment, is greater than the first compliant section of first end 104. Second end 106 has an outer surface 100 which is adapted to be received within the metallized surface 82 to finding the signal pin receiving holes 80 in circuit boards 78. In order to ensure that proper connection is achieved between the metallized surfaces 82 and the second end portions 106 of the board to connector pin 98, pin 98 is formed of a resilient conductive material and has a radially extending recess 102 defined in the second end portion 106. As a result, second end portion 106 can radially deflect to conform to the size of a pin receiving hole 80**, so as to be biased thereagainst.

In order to provide electrical connection between the circuit boards 78 within a single half-module, a board-to-board type connection pin 108 is used. Board-to-board type pins 108 include a first end portion 110 having a first compliant section, a neck portion 122 and a second end portion 116 having a second compliant section. In the preferred embodiment, neck portion 122 has a compliant section that is less than either the first or second compliant sections. First end portion 110 and second end portion 116 have outer surfaces 112, 118, respectively, which are sized to be received within holes 80 so as to bear against metallized surfaces 82. First and second end portions 110, 116 are further provided with radially extending recesses 114, 120, respectively, so as to allow the first and second ends to conform to the size of holes 80 and to bias outer surfaces 112, 118, respectively, against the metallized surfaces 82 so that a good electrical connection is achieved.

Second end portion 116 does not protrude from circuit board 78 far enough to make electrical contact with the dual-entry contact placed in through-hole 88 of connector block 86. In this fashion, electrical connection between, for example, circuit boards **78*a* and 78*b* is maintained within those two circuit boards only and no electrical connection is made through dual-entry connector block 86 to circuit boards 78*c* or 78*d***.

The tapered holes 81 of pin header blocks 84 are designed to allow easy insertion and removal of pins 110 and 124 from the half-modules by minimizing the drag area into which the pin must be pulled to complete insertion. For example, in the assembly of the upper half-module of FIG. 7, circuit boards **78*a* and 78*b* are positioned on the outer surfaces of cooling plate 14*a* with pin header block 84 positioned therebetween in a recess in cooling plate 14*a*. Pins 110 and 124 are then inserted from the outer side of circuit board 78*b* toward circuit board 78*a*. The resilient contact of the compliant sections having greater diameter will thus only contact the plated portions of holes 80 in circuit boards 78*a* and 78*b*. In this fashion, the use of tapered holes minimizes the force necessary to assemble and disassemble the half-module. The tapered holes also provide a self-aligning mechanism for insertion of the pins. Since the outer diameters of pins 110 and 124 in the preferred embodiment are approximately 18–24 mils, the possibility of slight misalignment between axially aligned holes 80 on circuit boards 78*a* and 78*b* is quite likely. In this case, slight misalignment is tolerated and the tapered holes 81** provide for allowance in misalignment.

In order to electrically connect two circuit boards within a half module and further provide a connection to circuit boards within the entire module via a dual-entry contact 90 in connector block 86, a board-to-board-to-connector type pin 124 is used. Pin 124 includes a first end portion 126 having a reduced cross-section 128 adapted for receipt within the dual-entry contact 90, an intermediate section 130 having a first compliant section defining an outer surface 132, a neck section 136 and a second end portion 138 having an outer surface 142 defining a second compliant section. Intermediate section 130 and second end portion 138 are both provided with radially extending recesses 134, 140 therein. The outer diameters of intermediate section 130 and second end portion 138 are sized to be received within the signal pin holes 80 provided on circuit boards 78, and the recesses 134, 140 allow outer surfaces 132, 142 to conform, respectively, with holes 80 so that a firm resilient connection is achieved with metallized surfaces 82. Neck portion 136 preferably has a reduced diameter relative to the diameters of intermediate section 130 and second end portion 138.

As a result of the reduced cross-sectional diameter of neck portions 122, 136 in pins 108, 124 respectively, the pins can be inserted and removed from the pin headers 84 and circuit boards 78 with a minimum of frictional resistance due to the lessened distance the outer diameter must be dragged through the holes in the circuit boards, which markedly reduces the total force required for assembly of the modules. This provides an important advantage over prior art designs, because the great force required for assembly of such modules can damage the pins even if they are but slightly misaligned.

Figure 10:
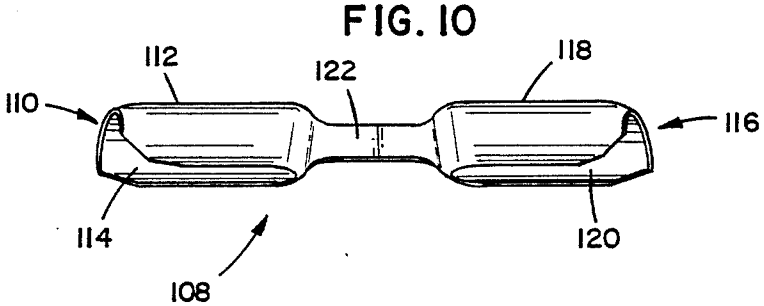
FIG. 10 is an isolated perspective view of a second species of connector pin according to the embodiment of FIG. 7.
Figure 11:
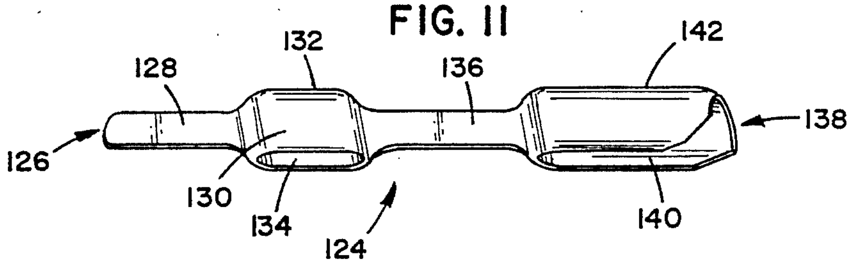
FIG. 11 is an isolated perspective view of a third species of connector pin according to the embodiment of FIG. 7.

Those skilled in the art will readily recognize that a wide variety of compliant pins may be substituted for the large/small diameter compliant pins described in FIGS. 9–11. For example, "eye of the needle" type of pins having resilient increased diameter sections substituted for the increased diameter sections 106, 110, 116, 130 and 138 will accomplish the same resilient connection. In addition, a bow-tie increased diameter section is also possible along with any other type of resilient attachment to the pin to increase its diameter at certain positions.

In the preferred embodiment of the present invention, the order of assembly of the complete module shown in FIG. 7 is designed to allow for easy maintenance or disassembly. As described above, the half-modules are first assembled. In the upper half-module, circuit boards **78*a* and 78*b* are attached about cooling plate 14*a* with pin headers 84 interposed therebetween. Pin types 98, 108 and 124 are then inserted through openings (plated holes) 80 of circuit board 78*b*, through tapered holes 81, and on through through-plated holes 80 of circuit board 78*a*. In a similar fashion, the lower half-module is assembled in the same order. After assembling the upper and lower half-modules, pin types 98 and 124 will have protruding reduced diameter sections which are to be inserted into dual-entry contacts 90 of connector blocks 86. The dual-entry contacts, such as the type shown in FIG. 3, are designed to receive the pin tips and make electrical contact therebetween. In order to facilitate assembly and removal of the upper and lower half-modules, however, the compliant sections of pin types 98 and 124 are designed so that a greater insertion and removal force is required for insertion and removal into circuit boards 78 than is required for the insertion and removal of the pin tips into the dual-entry contact 90. In this fashion, removal of the upper half-module from the lower half-module will result in pin types 98 and 124 remaining with the half-modules and not being pulled out of position to remain with connector block 86. Thus, the retention force on the pin tips applied by dual-entry contact 90 is much less than the retention force holding pin types 98 and 124 in position on the circuit board 78. Of course, the foregoing does not apply to pin type 108 since it does not contact the dual-entry contact 90**.

Also to ease assembly and disassembly of the entire module, the dual entry contacts are designed such that the contact force as applied to the pin tips on the lower half-module is 125–150 % greater than the retention force applied by the dual-entry contact 90 to the pin tips protruding from the upper half-module. In this fashion, when the half-modules are pulled apart, connector block 86 remains with the lower half-module, as shown in FIG. 7. Thus, a gap is shown between connector block 86 and circuit board **78*b* to exemplify the connector block remaining with the lower half-module. The variation of retention force applied by dual-entry contact 90 may be a function of the thickness of the material used to construct the dual-entry contact, the separation of the fingers on the dual-entry contact, the roughness of the contact, and other force variation techniques well known to those skilled in the connector art. In summary, the force used to hold pin types 98, 108 and 124** to the circuit boards is strong (2–4 pounds retention force), and the force used to hold the pin tips of pins 98 and 124 to dual-entry contact 90 of connector block 86 is small (on the order of 1–2 ounces retention force). In addition, the amount of force applied to the pin tips protruding from the lower half-module is 125–150 % greater than the amount of force applied to the pin tips protruding from the upper half-module.

Figure 8:
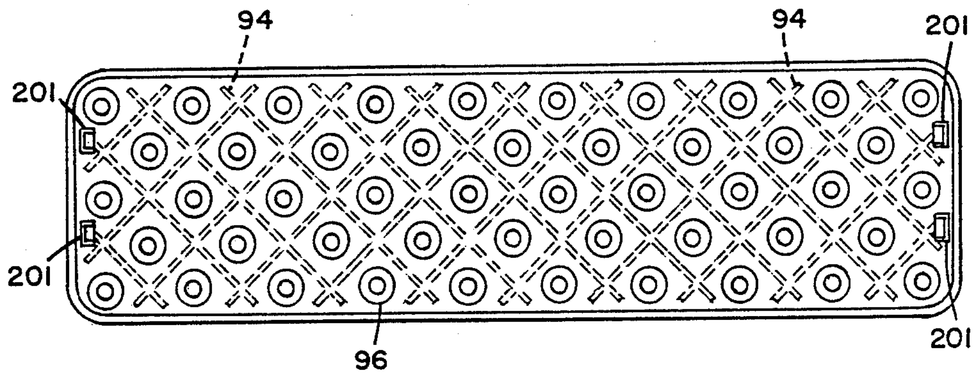
FIG. 8 is a top schematic view illustrating one species of shielding which may be used in a pin header or connector block according to either embodiment of the present invention.

Referring to FIG. 8, an alternative embodiment for shielding the pin header block and connector block of either of the above-discussed two embodiments is illustrated. In this embodiment, the shielding is constructed as a grid-shaped element 94 extending parallel to the axes of the signal pin bores 96, in the case of a pin header, or parallel to the connector bores in the case of a connector block. Grid-shaped element 94 is preferably connected to a source of constant potential through contacts 20 such as a constant DC voltage or ground, in the same manner as the wave-shaped elements 66 in the previously described embodiment. Because grid-shaped element 94 surrounds and isolates each of the signal pin or connector bores from each other, any connector pins inserted therethrough are completely shielded against inductive interference from another pin or pins.

Figure 12:
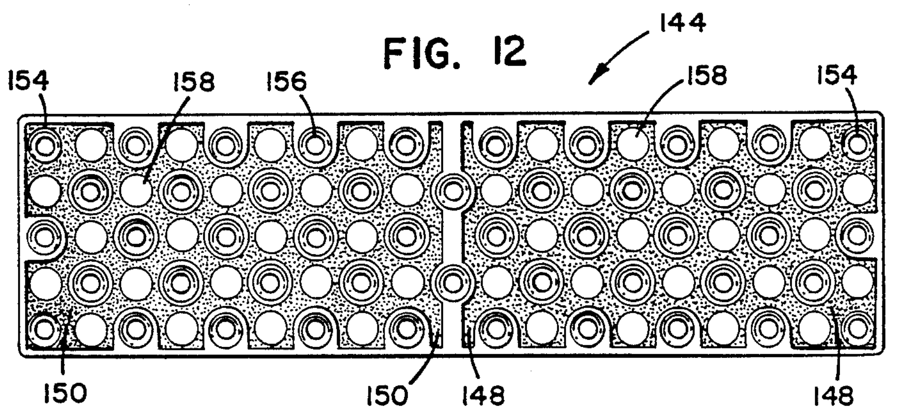
FIG. 12, is a top schematic view of an alternate species of shielding which may be used in either embodiment of the present invention.
Figure 13:
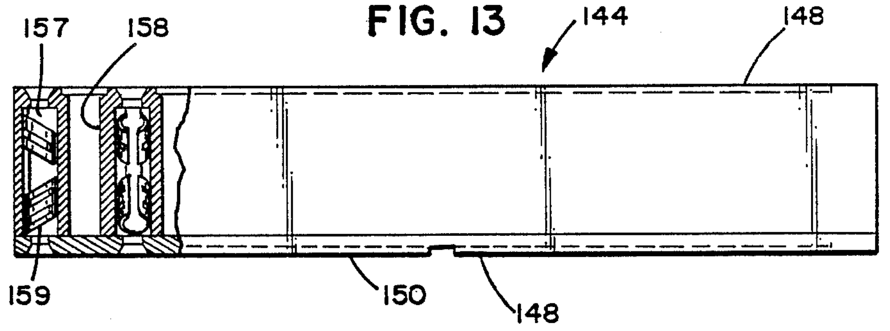
FIG. 13 is a side view of the shielding arrangement illustrated in FIG. 12, with parts broken away for clarity.
Figure 14:
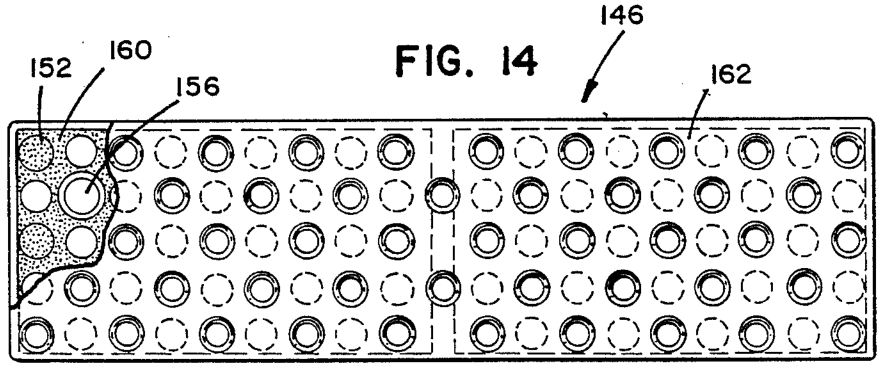
FIG. 14 is an alternate bottom view of the arrangement illustrated in FIGS. 12 and 13, with parts broken away for clarity.

Referring to FIGS. 12–14, several alternative shielding embodiments are depicted in the environment of a connector block 144, although it is to be understood that such shielding could also be used within a pin header. Shielded block 144 is constructed of a non-conducting base which includes a pair of metallized planar layers 148, 150 formed on at least one side of connector block 144, as is shown in FIG. 12. Metallized planar layer 148 (shaded portion on right of FIG. 12) is adapted for connection to a ground potential, while layer 150 (shaded portion on left of FIG. 12) is adapted for attachment to a constant source of DC potential. In the alternative, a single planar layer 148 may traverse the entire top of the connector block 144 and another single or split planar layer 148, 150 may traverse the entire bottom of connector block 144 as shown in FIG. 13. An array of signal pin openings 156 leading to connector holes 157 containing dual-entry contacts 159 are provided in connector block 144, as is shown in FIGS. 12 and 13. As is as also shown in FIG. 12, metallized planar layers 148, 150 are relieved around signal pin openings 156 so as to prevent shorting against a signal pin inserted therethrough.

In order to provide shielding for connector holes 157, a plurality of plated through-holes 158 are provided in connector block 144 so that each connector hole 157 is surrounded by several plated through-holes 158. Holes 158 are plated with a metallic conductive material that is electrically connected to the corresponding metallized planar layer 148 or 150 on either the top or bottom of the connector block. As a result, each connector hole 157 is partially shielded against inductive interference created by signals travelling through connector pins in other adjacent connector holes. The use of split planes on the top or bottom of connector block 144 may be desirable to provide alternate shielding plane potentials and to provide more than one current path for the ground and voltage planes between circuit boards.

Referring to FIG. 14, an alternate bottom plane is shown wherein a second pair of metallization planes 160 may be formed in proximate the bottom surface 162 of connector block 146. The bottom pair of planes 160 may be electrically connected to the corresponding top planar layers 148, 150 through the plated through-holes 158. In order to connect metallized planar layer 148 to a source of ground potential, a number of ground pin openings 154 are provided in FIG. 12 for insertion of a ground pin and are electrically connected with the metallized planar layer 148. Correspondingly, a number of DC voltage pin openings 152 are provided on the opposite side of connector block 146 and are electrically connected to the metallized planar layer 150. Voltage and ground potential is thus supplied to the metallized planar layers through pins from adjacent connector blocks, pin headers or circuit boards.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A multiple circuit module apparatus for use in an electronic device, comprising:

a plurality of circuit boards, each circuit board having a plurality of pin receiving recesses defined therein;

a plurality of cold plate means, at least one of said cold plate means positioned between two of said circuit boards, said cold plate means conducting heat from said circuit boards, each of said cold plate means having an open space defined therein for allowing electronic communication between said circuit boards;

a plurality of pin headers, each of said pin headers positioned within each of said open spaces, respectively, each pin header having a plurality of through-holes defined therein;

at least one connector block interposed between two of said circuit boards, said connector block having a plurality of dual-entry contacts defined therein;

a plurality of electrically conductive signal pin means for conducting an electrical signal from one of said boards to at least one other of said circuit boards, a respective signal pin means being selectively insertable into at least a respective one of said pin receiving recesses, a respective one of said through-holes a respective one of said dual-entry contacts depending on the desired path of the signal between said circuit boards; and means associated with at least one of said pin headers or connector block for shielding a selected number of said signal pin means against induction from other signal pin means.

2. Apparatus according to claim 1, wherein said signal pin means are solderable to at least one of said circuit boards.

3. Apparatus according to claim 1, wherein said pin receiving recesses are plated with an electrically conductive material.

4. Apparatus according to claim 3, wherein at least one of said signal pin means comprises an axially extending pin member having a first end portion sized for receipt in one of said dual-entry contacts, and a second end portion sized for receipt in one of said pin receiving recesses.

5. Apparatus according to claim 4, wherein said pin member is formed of an elastic material, and a radially extending recess is defined in said second end portion, whereby said pin means will elastically deform to fit snugly within at least one of said pin receiving recesses.

6. Apparatus according to claim 3, wherein at least one of said signal pin means comprises an axially extending pin member having a first portion sized for receipt in at least one of said pin receiving recesses, a second end portion sized for receipt in at least one of a second pin receiving recess, and an intermediate portion having a cross-section that is less than either said first or second end portions, whereby frictional resistance to inserting or removing said pin member is reduced.

7. Apparatus according to claim 6, wherein said pin member is formed of an elastic material, and said first and second end portions each have a radially extending recess defined therein, whereby said pin member will deform to fit snugly within at least one of said pin receiving recesses.

8. Apparatus according to claim 3, wherein at least one of said signal pin means comprises an axially extending pin member having a first end portion sized for receipt in at least one of said dual entry contacts, an intermediate section sized for receipt in at least one of said pin receiving recesses and a second end portion sized for receipt in at least one other of said pin receiving recesses.

9. Apparatus according to claim 8, wherein said pin member has a neck portion between said intermediate section and second end portion having a cross-section that is less than said intermediate section and less than said second end portion, whereby frictional resistance to inserting or removing said pin member is reduced.

10. Apparatus according to claim 9, wherein each said intermediate section and said second end portion have a radially extending recess defined therein, and said pin member is formed of an elastic material so as to deform at said intermediate section and said end portion to fit snugly within the respective pin receiving recesses.

11. Apparatus according to claim 1, wherein said means for shielding comprises electrically conductive means for electrically shielding extending parallel to the axes of and at least partially interposed between selected through-holes in at least one of said pin headers; and connecting means adapted for connecting said electrically conductive means to a source of constant electrical potential.

12. Apparatus according to claim 11, wherein said through-holes are arranged in an array of regularly spaced rows, and substantially aligned with next to adjacent rows.

13. Apparatus according to claim 12, wherein said electrically conductive means comprises at least one wave-shaped element positioned between adjacent rows of said through holes so as to preclude cross-talk between said signal pin means disposed therein.

14. Apparatus according to claim 12, wherein said electrically conductive means comprises a grid-shaped element defining subsections, said grid-shaped element positioned so that at least one of said through-holes is positioned within each of said subsections, whereby full shielding between signal pin means disposed within said through-holes is achieved.

15. Apparatus according to claim 12, wherein said connecting means comprises a metallized plane disposed proximate an upper surface of at least of said pin headers.

16. Apparatus according to claim 15, wherein a plurality of bores are defined in said one pin header between at least two of said through-holes, and said electrically conductive means comprises an electrically conductive material which is plated onto the surfaces defining said bores and is electrically connected with said metallized plane.

17. Apparatus according to claim 11, wherein said means for shielding further comprises an electrical conductor extending parallel to the axes of and at least partially interposed between selected dual-entry contacts in said at least one connection block; and means adapted for connecting said conductor to a source of constant electrical potential.

18. Apparatus according to claim 1, wherein, said shielding means for comprises an electrical conductor extending parallel to the axes of and at least partially interposed between selected dual entry contacts in said connector block, and means adapted for connecting said conductor to a source of constant electrical potential.

19. Apparatus according to claim 18, wherein said dual-entry contacts are arranged in an array of regularly spaced;

20. Apparatus according to claim 19, wherein said electrical conductor comprises at least one wave-shaped element positioned between adjacent rows of said dual-entry contacts so as to preclude cross-talk between signal pin means disposed therein.

21. Apparatus according to claim 19, wherein said electrical conductor comprises a grid-shaped element defining subsections and positioned within said one pin header so that one of said dual-entry contacts is positioned within each of said subsections, whereby full shielding between said pin means disposed within said through-holes is achieved.

22. Apparatus according to claim 19, wherein said connecting means comprises a metallized planar surface disposed proximate an upper surface of said connecting block.

23. Apparatus according to claim 22, wherein a plurality of bores are defined in said connecting block between at least two of said through-holes and said electrical conductor comprises an electrically conductive material plated onto the surfaces defining said holes and is electrically connected to said metallized planar surface.

* * * * *

UNITED STATES PATENT AND TRADEMARK OFFICE
CERTIFICATE OF CORRECTION

PATENT NO. : 4,939,624

DATED : July 3, 1990

INVENTOR(S) : Melvin C. August, et al

It is certified that error appears in the above-identified patent and that said Letters Patent is hereby corrected as shown below:

Column 10, line 46
INSERT --or-- after "through-holes".

Column 11, line 1
INSERT --member-- in place of "means".

Column 12, line 8
INSERT --one-- after "least".

Column 12, line 21
INSERT --connector-- in place of "connection".

Column 12, line 25
INSERT --means for shielding-- in place of "shielding means for".

Column 12, line 32
INSERT --rows.-- in place of ";".

UNITED STATES PATENT AND TRADEMARK OFFICE

CERTIFICATE OF CORRECTION

PATENT NO. : 4,939,624

DATED : July 3, 1990

INVENTOR(S) : Melvin C. August, et al

It is certified that error appears in the above-identified patent and that said Letters Patent is hereby corrected as shown below:

Column 12, line 37
INSERT --said-- before "signal".

Column 12, line 44
INSERT --signal-- before "pin".

Signed and Sealed this

Seventh Day of July, 1992

*Attest:*

DOUGLAS B. COMER

*Attesting Officer* *Acting Commissioner of Patents and Trademarks*